(12) United States Patent
Varshneya et al.

(10) Patent No.: US 7,233,606 B2
(45) Date of Patent: Jun. 19, 2007

(54) MINIATURE PULSED FIBER LASER SOURCE

(75) Inventors: Deepak Varshneya, Del Mar, CA (US); John Roes, San Diego, CA (US); Tony Maryfield, Poway, CA (US); Mike Roes, San Diego, CA (US); Lew Goldberg, Fairfax, VA (US); Jean Marc Delavoux, Fairfax, VA (US); Gabor Kulcsar, Fairfax, VA (US)

(73) Assignee: Cubic Corporation, San Diego, CA (US)

( * ) Notice: Subject to any disclaimer, the term of this patent is extended or adjusted under 35 U.S.C. 154(b) by 300 days.

(21) Appl. No.: 10/868,668

(22) Filed: Jun. 14, 2004

(65) Prior Publication Data

US 2005/0018715 A1    Jan. 27, 2005

Related U.S. Application Data

(60) Provisional application No. 60/478,901, filed on Jun. 13, 2003.

(51) Int. Cl.
*H01S 3/30* (2006.01)

(52) U.S. Cl. ................. 372/6; 359/341.32
(58) Field of Classification Search ............ 372/70, 372/6; 359/341.5, 337
See application file for complete search history.

(56) References Cited

U.S. PATENT DOCUMENTS

| | | | |
|---|---|---|---|
| 4,607,158 A | 8/1986 | Ovren | |
| 6,094,284 A | 7/2000 | Huber | |
| 6,347,007 B1 | 2/2002 | Grubb et al. | |
| 6,356,385 B1 * | 3/2002 | Digonnet et al. | 359/337 |
| 6,487,006 B1 * | 11/2002 | Chen | 359/341.32 |
| 6,518,562 B1 * | 2/2003 | Cooper et al. | 250/222.2 |
| 6,603,598 B1 * | 8/2003 | Oliveti et al. | 359/341.5 |

(Continued)

FOREIGN PATENT DOCUMENTS

EP    1211765 A2    6/2002

OTHER PUBLICATIONS

Desthieux, B., et al. "111 kW (0.5 mJ) pulse amplification at 1.5μm using a gated cascade of three erbium-doped fiber amplifiers", *Applied Physics Letters*, (1993) 63(5):586-588.

(Continued)

*Primary Examiner*—Minsun Oh Harvey
*Assistant Examiner*—Tuan N. Nguyen
(74) *Attorney, Agent, or Firm*—Townsend and Townsend and Crew (57) ABSTRACT

A pulsed fiber laser and associated electronics contained in a miniature package is disclosed. The Pulsed Fiber Laser Source (PFLS) can be a single-stage high gain master oscillator power amplifier (MOPA) type fiber laser source. The PFLS can include a distributed feedback (DFB) laser, a narrowband optical filter, a broad area high-power pump diode, and Erbium/Ytterbium (Er/Yb) double cladding doped fiber. Input electrical pulses drive the DFB laser diode to emit optical pulses that are then amplified by the optical amplifier. Active and passive cooling elements may be incorporated for continuous operation without rest time. Passive cooling for intermittent pulsed applications allows the laser source to be miniaturized by eliminating active cooling elements and associated power supplies and controllers. Low duty cycle relaxes drive requirements and further reduces the size. The PFLS can be used for long distance ranging, communication by retro-modulation, and communication in presence of atmospheric attenuation.

30 Claims, 4 Drawing Sheets

OTHER PUBLICATIONS

Taverner, D., et al. "158-μJ pulses from a single-transverse-mode, large-mode-area erbium-doped fiber amplifier", *Optics Letters*, (1997) 22(6):378-380.

Go, H., et al. "Compact optical module for EDFA", *Proceedings of 1995 Japan International Electronic Manufacturing Technology Symposium*, New York, NY (1995) 264-267.

* cited by examiner

MINIATURE PULSED FIBER LASER SOURCE

CROSS-REFERENCES TO RELATED APPLICATIONS

This application claims the benefit of U.S. Provisional Application No. 60/478,901, filed Jun. 13, 2003, entitled "MINIATURE PULSED FIBER LASER SOURCE", hereby incorporated herein by reference in its entirety.

BACKGROUND OF THE DISCLOSURE

Wireless signaling applications, including optical signaling applications, can be limited by the level of transmit power as well as the level of receiver sensitivity. Improving receiver sensitivity allows for greater link margins for a given transmit power level. Similarly, increasing the transmit power level can increase link margins for a given receiver sensitivity. Extremely high-power laser pulses can be used to improve the performance of many Free-Space Optical (FSO) applications. Examples of FSO applications include, but are not limited to, ranging to cooperative and non-cooperative targets, and communicating by retro-modulation at long ranges and in the presence of atmospheric attenuations.

Optical ranging can be performed, for example, in a system that transmits a modulated or pulsed optical signal towards a target. The system can then receive a signal reflected by the target. The system can determine a range based in part by determining the time for the optical signal to traverse the distance to the target and return. FSO communication systems can modulate an optical source with a data signal. A remote receiver can receive the optical signal to extract the data. Typical FSO communication systems use continuous wave (CW) or on-off keying (OOK) modulation because of their low-optical power.

However, most presently available high-power optical sources, such as those having output optical power levels on the order of kilo watts, have limited FSO applications because of their large sizes, high electrical power consumptions, and eye-safety constraints. A large physical size of an optical source can make the source unsuitable for portable applications. Similarly, high electrical power consumption makes the optical source unsuitable for mobile applications due to the size of an associated power source needed to supply electrical power to the unit. Furthermore, high power optical sources pose potential eye-safety hazards. Additional controls can be added to a high power optical source to help alleviate the eye-safety hazards. However, the additional controls used to satisfy eye-safety constraints typically compound the physical size and power consumption problems associated with presentaly available high power optical sources.

It is desirable to have a high power optical source that is capable of integration into a system for use in a portable application. It would be advantageous to maximize optical power while minimizing physical size and electrical power consumption. Additionally, such an optical source should satisfy safety constraints, such as those associated with eye safety.

BRIEF SUMMARY OF THE DISCLOSURE

A pulsed fiber laser and associated electronics contained in a miniature package is disclosed. The Pulsed Fiber Laser Source (PFLS) can be a single-stage high gain master oscillator power amplifier (MOPA) type fiber laser source. The PFLS can include a distributed feedback (DFB) laser, a narrowband optical filter, a broad area high-power pump diode, and Erbium/Ytterbium (Er/Yb) double cladding doped fiber. Input electrical pulses drive the DFB laser diode to emit optical pulses that are then amplified by the optical amplifier. Active and passive cooling elements may be incorporated for continuous operation without rest time. Passive cooling for intermittent pulsed applications allows the laser source to be miniaturized by eliminating active cooling elements and associated power supplies and controllers. Intermittent operation can allow the pump and data laser diodes to be passively cooled. Low duty cycle relaxes drive requirements and further reduces the size. The PFLS can be used for long distance ranging, communication by retro-modulation, and communication in presence of atmospheric attenuation.

In one aspect a pulsed fiber laser is disclosed. The pulsed fiber laser includes a first optical source having an output configured to operate at a first optical wavelength, an optical fiber coupled to the output of the first optical source, a second optical source having an output coupled to the optical fiber and configured to operate at a second optical wavelength, and to provide a pump signal to the optical fiber, and a narrowband optical filter coupled to the optical fiber and having a passband that includes the first optical wavelength. The filter is configured to suppress an amplified spontaneous emission in the optical fiber.

In another aspect, a pulsed fiber laser is disclosed. The pulsed fiber laser includes a distributed feedback (DFB) laser having an output configured to provide a pulsed output at a pulsed repetition frequency and a first optical wavelength, an Erbium/Ytterbium (Er/Yb) doped double clad optical fiber coupled to the output of the DFB laser, a laser diode configured to pump a cladding layer of the Er/Yb doped double clad optical fiber, and an optical filter coupled to the Er/Yb doped double clad optical fiber and having a passband that includes the first optical wavelength.

In yet another aspect, a pulsed fiber laser is disclosed. The laser includes an electrical pulse generator configured to generate electrical pulses, a distributed feedback (DFB) laser having an electrical input coupled to the electrical pulse generator and an optical output, and configured to provide a pulsed optical output signal at a wavelength of approximately 1550 nm in response to the electrical pulses, an Erbium/Ytterbium (Er/Yb) fiber amplifier coupled to the optical output of the DFB laser and configured to amplify the DFB laser pulsed optical output signal, a pump diode laser having an output wavelength of approximately 950 nm and configured to provide v-groove side pumping of the Er/Yb fiber amplifier, a power supply configured to selectively energize the pump diode laser, and a narrowband optical filter coupled to the fiber amplifier. The filter is configured to have a passband including a wavelength of the pulsed optical output signal and is further configured to suppress amplified spontaneous emission generated in the fiber amplifier.

In yet another aspect, a method for generating a pulsed laser output is disclosed. The method includes generating seed optical pulses, coupling the seed optical pulses to a single mode layer of an Erbium/Ytterbium (Er/Yb) double clad optical fiber, pumping an Er/Yb clad layer of the Er/Yb double clad fiber with an optical output from a pump diode, amplifying the seed optical pulses at least in part in response to pumping the Er/Yb clad layer, and suppressing amplified spontaneous emissions generated in the Er/Yb double clad optical fiber.

In still another aspect, a pulsed fiber laser includes means for generating seed optical pulses, means for amplifying seed optical pulses coupled to the means for generating seed optical pulses, and means for suppressing amplified spontaneous emissions generated by the means for amplifying the seed optical pulses.

BRIEF DESCRIPTION OF THE DRAWINGS

The features, objects, and advantages of embodiments of the disclosure will become more apparent from the detailed description set forth below when taken in conjunction with the drawings, in which like elements bear like reference numerals.

DETAILED DESCRIPTION OF THE DISCLOSURE

A miniature pulsed fiber laser source based on a single stage Master Oscillator Power Amplifier (MOPA) configuration is disclosed. In one embodiment, the pulsed fiber laser source includes a distributed feedback (DFB) laser that supplies optical pulses to a Erbium/Ytterbium (Er/Yb) double clad fiber. A high power pump diode is used to pump the Er/Yb fiber to amplify the DFB laser output signal. A narrowband optical filter can be used to suppress amplified spontaneous emissions in the amplifier to allow high amplifier gain. The amplifier gain can be approximately 55 dB when the amplified spontaneous emissions are suppressed.

Figure 1:
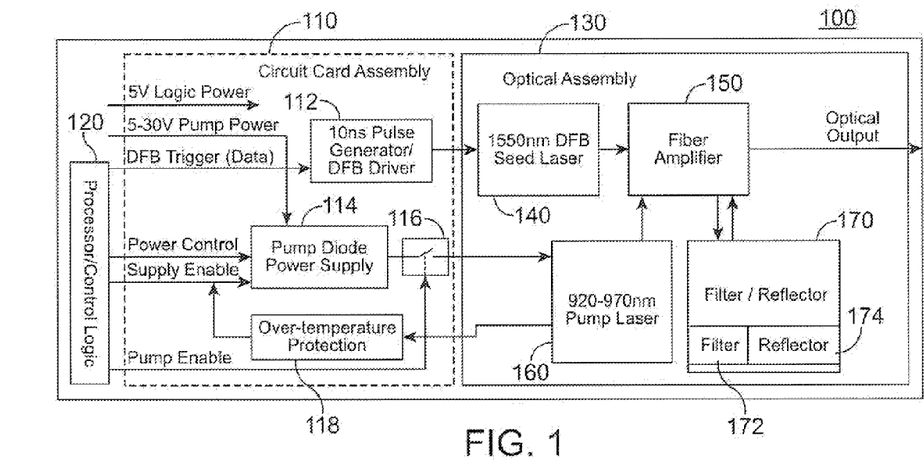
FIG. 1 is a functional block diagram of an embodiment of a pulsed fiber laser source.

FIG. 1 is a functional block diagram of an embodiment of a miniature Pulsed Fiber Laser Source (PFLS) 100. The PFLS 100 can be configured as two major assemblies. An optical assembly 130 can include substantially all of the optical components. A circuit card assembly 110 can include the majority of the electronics required to support the optics. A processor control logic module 120 can be coupled to the circuit card assembly and can provide an interface between the PFLS 100 electronics and a controller (not shown) which may include a processor executing software stored in memory.

The optical assembly 130 can include a first optical source coupled to a fiber amplifier 150 that is configured to amplify the optical output of the first optical source. A second optical source can be configured as a pump source for the fiber amplifier 150. A filter/reflector module 170 can be coupled to the fiber amplifier 150 and configured to suppress unwanted emissions, such as amplified spontaneous emissions (ASE).

The optical assembly 130 can include a first optical source operating at a first optical wavelength. The first optical source can be, for example, a DFB laser diode 140. The first optical source need not be a DFB but can be some other type of optical source.

In one embodiment, the DFB laser diode 140 is a uncooled laser diode operating at an output optical wavelength of approximately 1550 nm. The DFB laser diode 140 can be controlled to provide a pulsed optical output that are used as seed pulses for a subsequent amplification stage. The DFB laser diode 140 can be configured such that it requires no active cooling. Because the DFB laser diode 140 may rely on passive cooling techniques, it may be termed an uncooled DFB laser diode 140. In other embodiments, the DFB laser diode may be actively cooled.

The optical output of the DFB laser diode 140 can be coupled to a fiber amplifier 150. In one embodiment, the fiber amplifier 150 is configured as a double clad optical fiber. The double clad optical fiber can include a cladding layer doped with rare earth elements, such as rare earth elements from the Lanthanide series. The rare earth elements can include, for example, Erbium, Ytterbium, or some combination of Erbium and Ytterbium. In one embodiment, the fiber amplifier includes a dual clad Er/Yb doped optical fiber.

The optical output of the DFB laser diode 140 can be end coupled to the core of the dual clad Er/Yb doped optical fiber of the fiber amplifier 150. The fiber amplifier 150 is configured to amplify the output of the DFB laser diode 140. The amplified output from the fiber amplifier 150 can be the optical output of the PFLS 100.

A second optical source operating at a second optical wavelength can be configured to provide a pump signal to the fiber amplifier 150. In one embodiment, the second optical source is a pump laser diode 160. The pump laser diode 160 can be configured to pump a cladding layer of the dual clad Er/Yb doped optical fiber of the fiber amplifier 150.

The pump laser diode 160 can be selected to provide an optical output at a second optical wavelength that is within an absorption band of an element of a doped layer of the dual clad optical fiber of the fiber amplifier 150. For example, the pump laser diode 160 may provide an output in the absorption band of Ytterbium. The wavelength of the pump laser diode 160 may have a significant optical output within the band of 0.8–1.1 µm. In another embodiment, the pump laser diode 160 may have a significant optical output within the band of 920–970 nm.

The pump laser diode 160 is not required to have a narrow band optical output and may have a relatively broad band optical output having a bandwidth of 20 nm, 40 nm, 50 nm, 60 nm or more. The pump laser diode 160 can be uncooled or passively cooled. That is, in some embodiments, the pump laser diode 160 may not have any active cooling. In other embodiments, the pump laser diode may be actively cooled.

The pump laser diode 160 can be configured to provide an output optical power that is controlled in part based on an pump power control voltage. Typically, the pump laser diode 160 is configured to operate at maximum optical power. Although a single pump laser diode 160 is shown in FIG. 1, other embodiments may have more than one pump source. for example, multiple pump laser diodes 160 can be used to pump the fiber amplifier 150.

The pump laser diode 160 can be configured to provide approximately 1–10 watts of optical power. The DFB laser diode 140 can be configured to provide 1–10 mW of average power. In some embodiments, the DFB laser diode 140 can be configured to provide approximately 1 mW optical power. In other embodiments, the DFB laser diode 140 can be configured to provide 3 mW, 5 mW, 6 mW, 10 mW, less than 3 mW, less than 5 mW, less than 10 mW, or some other level of optical power. If the DFB laser diode 140 is configured to provide 3 mW of optical power and the fiber amplifier 150 is configured to provide 55 dB of optical gain, the PFLS 100 can provide approximately +60 dBm, or approximately 1000 watts of output optical power. The PFLS 100 can provide approximately +65 dBm, or approximately 3000 watts, of optical power if the DFB laser diode 140 provides 10 mW, or +10 dBm, of optical power and the fiber amplifier 150 is configured to provide 55 dB of gain.

The optical assembly 130 can also include a filter/reflector module 170 coupled to the fiber amplifier 150. The filter/reflector module 170 can include a filter 172, reflector 174, or combination of filter 172 and reflector 174. The filter/reflector module 170 can be configured to suppress undesired emission, such as scattering, Rayleigh scattering, or ASE that may operate to limit or other wise clamp the amount of gain available from the fiber amplifier 150.

The gain of a fiber amplifier 150 can be limited by the amount of ASE generated in the amplifier. A filter 172 having a narrow optical bandwidth can be used to suppress the ASE generated in the fiber amplifier 150. The filter 172 can have, for example, a bandwidth that is 1–5 nm, less than 3 nm, less than 4 nm, or less than 5 nm. The filter 172 can be, for example, a fiber Bragg grating or a thin film filter. With the ASE suppression filter 172, the fiber amplifier 150 can achieve a small signal gain of approximately 55 dB, as limited by lasing caused by double-Rayleigh scattering in the gain fiber.

To permit the PFLS 100 to operate over a large temperature range, for example 0 to +50° C. or −20 to +50° C., a temperature tuning coefficient of the filter 172 may approximate that of the DFB laser diode 140. Matching the filter temperature coefficient to that of the DFB laser diode 140 allows the filter 172 to have a narrower bandwidth than would be used if the filter bandwidth needed to account for variations in the DFB laser diode 140 output.

For example, the temperature tuning of the DFB laser diode 140 may be approximately 0.1 nm per degree C. The filter/reflector module 170 can be configured to package a filter 172 in a thermo-mechanical fixture. The filter/reflector module 170 can thus be configured such that the temperature tuning coefficient of the filter 172 approximates that of the DFB laser diode 140.

The temperature tuning coefficient of the of the pump laser diode 160 can be of less concern depending on the output wavelength from the device. In one of the embodiments described above, the pump laser diode 160 can have an output wavelength in the band of 920–970 nm. The wavelength of the pump laser diode 160 can be configured to be approximately 950 nm so that it is approximately centered in the 920–970 nm band. The pump diode laser 160 having an output wavelength of approximately 950 nm can have a relatively large temperature tuning coefficient without affecting the effectiveness of the pumping energy. The temperature tuning coefficient of the pump laser diode 160 can be approximately 0.3 nm per degree C. This amount of output drift has relatively little effect over the operating temperature range of 0 to +50° C. or −20 to +50° C.

Because the pump laser diode 160 can be configured to operate over the entire operating temperature range, no warm-up time is required. This allows the PFLS 100 to have a very rapid turn-on time of few ms rather than a turn-on time on the order of several seconds that would be otherwise required if the pump laser diode 160 needed to be temperature stabilized before PFLS 100 activation.

Similar benefits stem from the use of an uncooled DFB laser diode 140. Use of an uncooled DFB laser diode 140 can allow the PFLS 100 to maintain a relatively high overall power efficiency and avoid slow warm-up time that would be required if the DFB laser diode 140 temperature needed to be stabilized before PFLS 100 turn-on.

The circuit card assembly 110 includes the electronics associated with the optical assembly 130. The circuit card assembly 110 include a pulse generator 112 having an output coupled to an electrical input of the DFB laser diode 140. The pulse generator 112 can be configured to receive a trigger signal from the processor control logic module 120.

The circuit card assembly 110 can also include a power supply 114 that supplies the power to the pump laser diode 160. The power supply 114 output can be coupled to a switch 116 that selectively couples the power supply 114 output to a power supply input of the pump laser diode 160. The power supply 114 can be configured to convert power from an external power source (not shown) to a voltage and regulation that is suitable for the pump laser diode 160. In one embodiment, the external power source is an unregulated DC power source and the power supply 114 is configured as a DC-DC converter. In another embodiment, the power supply 114 can be a linear regulator. In still other embodiments, the external power source can be an AC source and the power supply 114 can be an AC-DC converter. Thus, the power supply 114 can be virtually any type of device for converting power.

The power supply 114 can also be configured to selectively convert the external power based in part on control signals. In one embodiment, the power supply 114 can be configured to receive power control and supply enable signals from the processor control logic module 120 that can be used to direct the power supply 114 output voltage and can activate the power supply 114.

The switch 116 coupled to the output of the power supply 114 can be controlled to selectively couple the output of the power supply 114 to the pump laser diode 160 on the optical assembly 130. A pump enable signal from the processor control logic module 120 can be used to selectively open or close the switch 116.

An over temperature protection module 118 can be configured to sense a temperature of the pump laser diode 160 and can be configured to generate a power supply 114 control signal based in part on the temperature. For example, the over temperature protection module 118 can be configured to disable the power supply 114 if the sensed temperature exceeds a predetermined threshold. In other embodiments, the over temperature protection module 118 can be configured to reduce the power supply 114 output based at least in part on a sensed temperature.

The power control logic module 120 can be used to interface an external processor or controller (not shown) to the circuit card assembly 110. The power control logic module 120 can include, for example, registers, Digital to Analog Converters (DAC), multiplexers, and other logic that can be used to interface a controller to the circuit card assembly 110. The processor or controller can be configured to control the operation of the circuit card assembly 110 and thus, the PFLS 100.

In one embodiment the DFB trigger signal can represent data that modulates the DFB laser diode 140. The DFB trigger signal can couple to the input of the pulse generator 112. The pulse generator 112 can be configured to generate pulses, such as pulses that are approximately 10 ns in duration, in response to the DFB trigger signal. The pulse generator 112 provides the pulses to the electrical input of the DFB laser diode 140, which in turn generates optical pulses at the output optical wavelength. For example, the DFB laser diode 140 can generate 1550 nm optical pulses that are approximately 5–10 ns in duration in response to the 10 ns electrical pulses from the pulse generator 112.

The optical pulses output by the DFB laser diode 140 can repeat at a predetermined pulse repetition rate (PRF). The pulse generator 112 may periodically receive DFB trigger signals at the PRF and may in turn enable the DFB laser diode 140 to produce the pulse pattern.

The pump laser diode 160 is turned on when the PFLS 100 receives a pump enable signal, such as from a processor or controller (not shown). The output power of the pump laser diode 160 and the output power of the PFLS 100 can be controlled by a pump power control signal. In one embodiment, the output of the power supply 114 is controlled by a pump power control voltage that can span a 0–1 V range.

Typically, the pump laser diode 160 operates at maximum optical power unless the end-to-end system calls for power reduction. The system may desire reduced optical power, for example, due to receiver saturation, presence of obstructions, or sudden beam interruption and saturation. The pump laser diode 160 can be configured to operate continuously for up to tens of seconds and can be configured to "rest" between two consecutive continuous operations to allow for cooling. The operation duty cycle can be configured to be less than or approximately equal to 50%. For example, the operational duty cycle can include a 30 second resting time between 30 second continuous operation to provide essentially a 50% duty cycle. To further reduce the power consumed, the pump laser diode 160 can be energized at a duty cycle that approximately matches the PRF of the pulsed DFB laser diode 140. Thus, during the period of time that the pump laser diode 160 is considered to be active or operational, the pump laser diode 160 is energized at approximately the PRF of the DFB laser diode 140.

Figure 2:
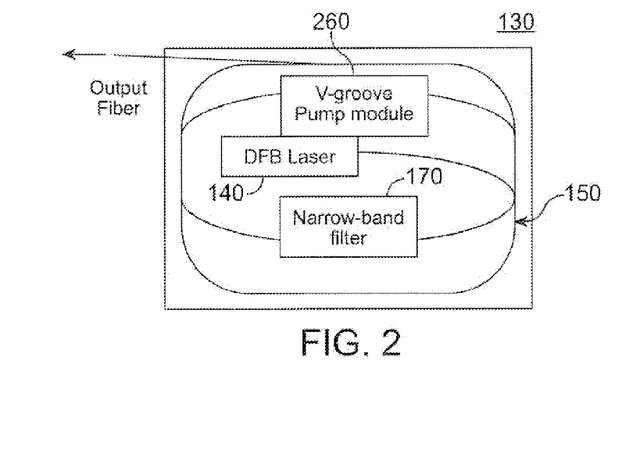
FIG. 2 is a functional block diagram of an embodiment of an optical portion of a pulsed fiber laser source.

FIG. 2 is a functional block diagram of an embodiment of the optical assembly 130 showing the relative relationship of the optical components. The optical assembly 130 can be, for example, the optical assembly 130 of the PFLS 100 of FIG. 1. The DFB laser diode 140 can be positioned to end couple an optical signal to the core of a dual clad Er/Yb doped optical fiber that is used as the fiber amplifier 150. The length of optical fiber can be, for example, coiled around the outside perimeter of the optical assembly 130 in order to maximize the bend radius available for the optical fiber.

A V-groove pump module 260 can be configured to couple the energy from the pump laser diode (not shown) to a v-groove location on a loop of fiber passing through the V-groove pump module 260. The pump laser diode within the V-groove pump module 260 can be configured to pump a doped cladding layer of the optical fiber. In an embodiment, the pump laser diode is configured to side pump an Er/Yb clad layer of the optical fiber. The pump laser diode can be configured, for example, to v-groove side pump the Er/Yb clad layer of the optical fiber. A v-groove can be positioned on a location of the fiber and the pump laser diode and a collimator lens (not shown) can be positioned to illuminate a fave of the v-groove. The V-groove pump module 260 can use more than one v-groove coupled source. For example, a plurality of pump laser diodes can each be configured to illuminate a corresponding v-groove positioned on the fiber. The v-groove side pump configuration can be used for high coupling efficiency and compact packaging.

The filter/reflector module 170 can be coupled to the fiber amplifier 150 and can suppress the ASE generated by the fiber amplifier 150. In one embodiment, the filter/reflector module 170 is coupled to an end of the fiber amplifier 150 opposite the DFB laser diode 140. An optical output can be coupled from the fiber amplifier 150. In another embodiment, the optical output can be coupled to the end of the fiber amplifier 150 opposite the DFB laser diode 140 and the filter/reflector module 170 can be coupled to the fiber amplifier 150 using, for example, a Wavelength Division Multiplexer (WDM). An optical circulator (not shown) can be positioned in the output fiber to reduce the effects of external reflections. In another embodiment, a loop of the fiber passes through a narrowband filter in the filter module.

Figure 3A:
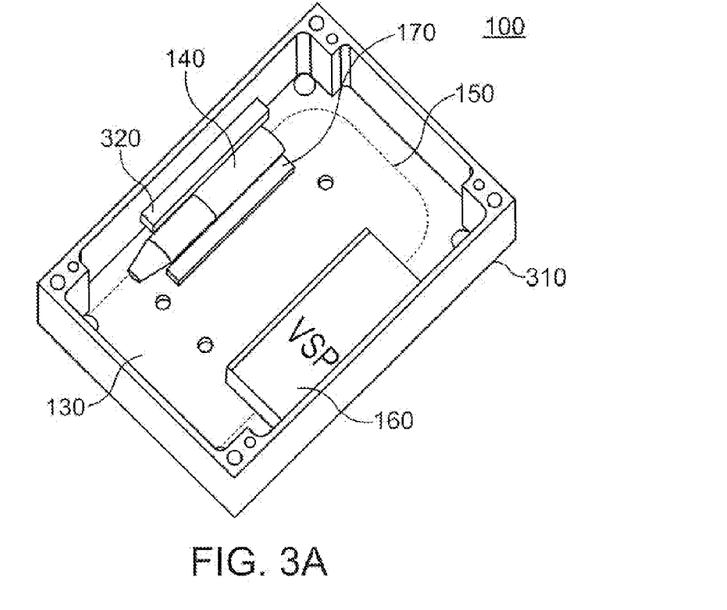
FIGS. 3A–3B are illustrations of an embodiment of a physical implementation of a pulsed fiber laser source.
Figure 3B:
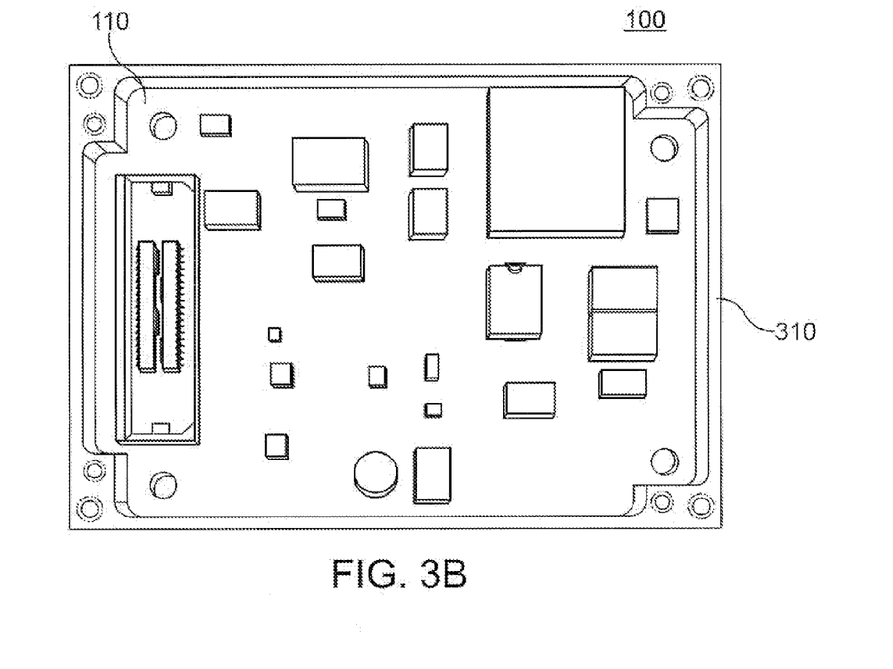

FIGS. 3A–3B are illustrations of an embodiment of a PFLS 100 assembly. FIG. 3A illustrates an embodiment of an optical half of the PFLS 100 assembly and FIG. 3B illustrates an embodiment of an electronic half of the PFLS 100 assembly.

FIG. 3A shows the optical half of the PFLS 100. The optical assembly 130 is located in one half of a housing 310, which may be an aluminum housing. The optical assembly 130 of the embodiment shown in FIG. 3A is approximately 60 mm×43 mm. The entire PFLS 100 can be packaged in a housing 310 that is less than approximately 20 mm high to result in a complete PFLS 100 assembly of less than 52 cm$^3$. Additionally, the electrical and optical design of the PFLS 100 allows the assembly to use on the order of few tens of watts.

Splitting the PFLS 100 into an optical half and an electrical half allows the PFLS 100 to be manufactured in a compact size. Because the optical assembly 130 and electrical circuit card assembly 110 are physically separated, each assembly can be fabricated, tested or otherwise qualified, repaired, or replaced independently of the other assembly.

The optical assembly 130 includes the DFB laser diode 140 driving a core of the fiber amplifier 150. The pump laser diode 160 is configured to v-groove side pump the fiber amplifier 150. The filter/reflector module 170 is positioned physically close to the DFB laser diode 140 such that the filter/reflector module 170 is exposed to approximately the same temperature as the DFB laser diode 140. An optical circulator 320 can be positioned in the output fiber.

FIG. 3B illustrates an embodiment of the circuit card assembly 110 positioned in the side of the housing 310 opposite the optical assembly 130 shown in FIG. 3A. To maintain the compact size of the PFLS 100, the circuit card assembly 110 can be manufactured with surface mount devices. Surface mount devices can also reduce the cost to manufacture the circuit card assembly and may be more resistant to damage by Electro Static Discharge (ESD).

Figure 4:
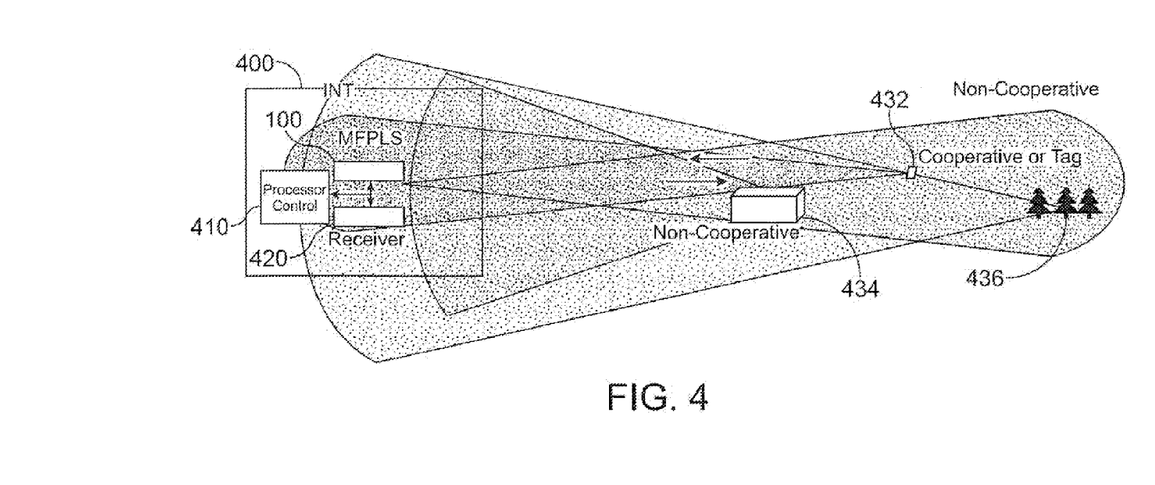
FIG. 4 is a functional block diagram of an embodiment of a ranging system using a pulsed fiber laser source.

FIG. 4 is a functional block diagram of a PFLS 100 integrated in to an optical communication unit referred to as an interrogator (INT) 400 that can be configured to perform 1) ranging to cooperative and non-cooperative targets, 2) locating one or more targets, 3) identifying one or more targets and 4) communicating with one or more targets. The interrogator 400 includes a processor control module 410 that is coupled to a PFLS 100. The PFLS 100 can be, for example, the PFLS 100 of FIG. 1 packaged as shown in FIG. 3. The processor control module 410 can be configured to generate the data and control signals used by the PFLS 100. The interrogator 400 also includes a receiver 420 which can be an optical receiver that is configured to receive a signal at approximately the same wavelength that is transmitted by the PFLS 100.

The interrogator 400 can be configured to perform ranging to a target illuminated by the PFLS 100. The range can be determined by a number of techniques. For example, the interrogator 400 can determine a range by determining a time delay of arrival of a signal transmitted to a target and reflected to the receiver 420.

The target space illuminated by the PFLS 100 can include a number of objects. For example the target space illuminated by the PFLS 100 can include non-cooperative targets 434 and 436 as well as cooperative targets 432. A non-cooperative target, for example 434, can be any target that is not configured to be reflective or otherwise responsive to the signal emanating from the PFLS 100. Non-cooperative targets can include man made objects, such as a building or structure, or some other non-cooperative target 434, as well as naturally occurring objects, such as a stand of trees 436 or a terrestrial feature.

Since non-cooperative targets, for example trees 436, typically have low surface reflectivity and undefined shapes, the reflected optical signal is weaker and spreads over larger area than signals reflected by cooperative targets 432. Therefore, ranging to non-cooperative targets can present a challenge to systems using low optical power. The problem is further worsened in the presence of atmospheric attenuations.

In the embodiment shown in FIG. 4, the interrogator 400 can be configured to range to the cooperative target 432 located in the presence of reflective elements such as trees 436, ground and buildings, or some other non-cooperative target 434. The PFLS 100 high-power and narrow laser pulses permit the interrogator 400 to range to distances much longer than traditional lower-power signals, discriminate between the cooperative target 432 and its surrounding area, including the non-cooperative targets 434 and 436. The high power narrow PFLS 100 output allows the interrogator 400 to operate in presence of atmospheric attenuation such as fog, rain, and haze. For instance, if the building or some other non-cooperative target 434 has 50% reflectivity, covers 75% of the transmit beam and is placed at half the distance between the interrogator 400 and the desired cooperative target 432, the interrogator 400 can still locate the cooperative target 432.

Figure 5:
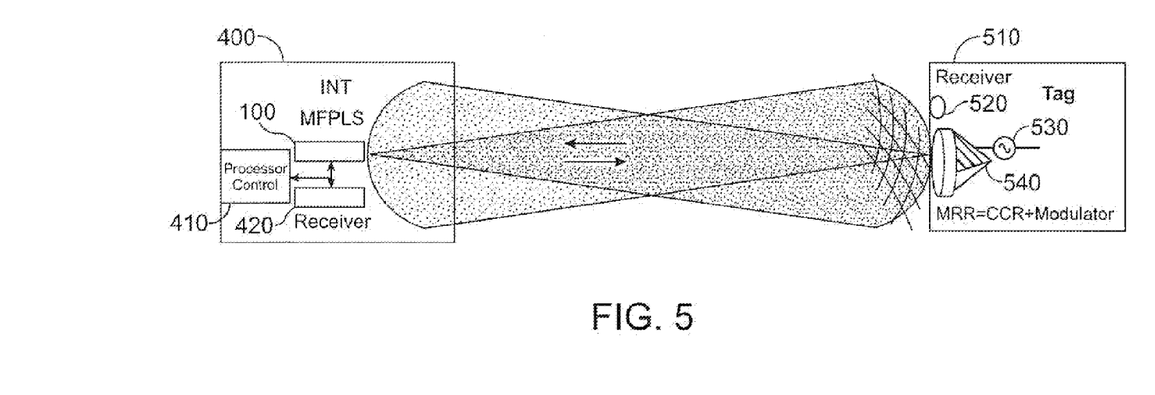
FIG. 5 is a functional block diagram of an embodiment of a free space optical communication system using a pulsed fiber laser source.

FIG. 5 is a functional block diagram of an embodiment in which the interrogator 400 having the PFLS 100 is configured in an optical communication system, such as an optical combat system. In optical an combat system, the cooperative target 432 of FIG. 4 is an active target and is referred to as a tag 510. The tag 510 can include a modulating retro-reflector element (MRR) 540. The MRR can include a corner cube reflector (CCR) and modulator 530.

The communication between the interrogator 400 and the tag 510 can be bi-directional and asynchronous. The communication protocol can be configured to allow the tag 510 subsystems to tune to interrogator 400 wavelength. By using the PFLS 100 high-power optical output having narrow-pulses, the communication can be optimized. The tag 510 receiver 520, MRR modulator 540 and interrogator 400 receiver 420 can be synchronized to the incoming pulses by windowing the signal processing interval. This feature can minimize internal noise and channel degradation effects.

The high PFLS 100 power allows the system to have high operating link margins in the forward link (from interrogator 400 to tag 510) and roundtrip link (interrogator 400 to MRR 540 and back to interrogator 400) to combat atmospheric attenuations during communication.

The high PFLS 100 optical power also allow the interrogator 400 to better assess channel condition to optimize communication parameters and monitor channel degradation. Although passive cooling within the PFLS 100 is typically sufficient for operating in most systems, the PFLS 100 can implement larger passive heatsinks or active cooling elements to enable the communication between interrogator 400 and tag 510 to be continuous. Continuous operation allows the system to support long duration real-time data transfer. The integration of larger heatsinks or active cooling allows continuous operation but comes at the cost of packaging size or increased power consumption.

A temperature discrepancy between the interrogator 400 and the tag 510 locations can be resolved by characterizing the PFLS 100 wavelengths drift with temperature. A lookup table can be implemented in the tag 510 to allow the tag 510 subsystems to precisely tune to the PFLS 100 wavelength.

Figure 6A:
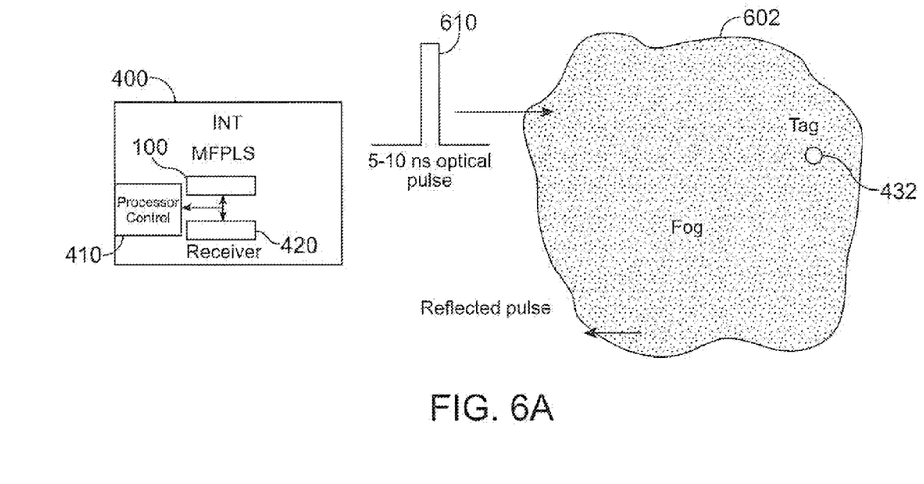
FIGS. 6A–6B are illustrations of an example of a communication signal in the free space optical communication system of FIG. 5.

FIG. 6A shows a functional diagram of an embodiment of an interrogator 400 operating in the presence of adverse atmospheric conditions such as fog 602 or rain. The PFLS 100 in response to control of the processor control module 410 can transmit one or more narrow optical pulses 610. The optical pulse 610 can be, for example a 5–10 ns duration optical pulse of approximately 1550 nm wavelength. In the presence of fog 602, the sharp transmitted optical pulse 610 can be simultaneously reflected by the cooperative target 432 and fog 602.

Figure 6B:
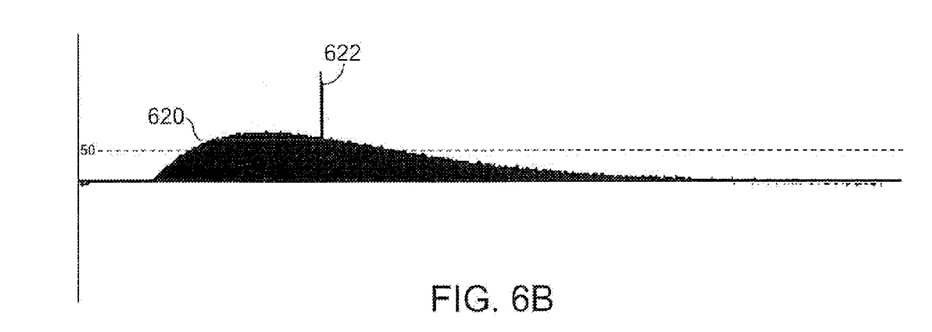

FIG. 6B illustrates an example of the pulse that is received at the receiver 420 in the operating condition shown in FIG. 6A. The reflected pulse includes a component that is spread in time 620, in part due to the dispersive effects of fog 602, and has a sharp peak 622 corresponding to the cooperative target 432 or tag having relatively high surface reflectivity. The interrogator 400 can use the reflected pulse characteristics to define the communication channel condition and set the PFLS 100 optical power accordingly.

Due to the high-level of optical power and pulse repetition frequency (PRF) supported by the PFLS 100, an automatic power reduction (APR) mechanism can be implemented within the interrogator 400 to comply with a predetermined system eye-safety requirement. This feature is implemented by detecting sudden beam interruption or receiver saturation and adjusting the PFLS 100 optical power in response to detecting the occurrence of the predetermined events. The interrogator 400 can initially be configured to operate the PFLS 100 at full optical power. The processor control module 410 can be configured to operate the pump laser diode at its maximum output power. Additionally, the DFB laser diode and pump laser diode can operate at a maximum PRF. The receiver 420 within the interrogator 400 can monitor the reflections to perform ranging or optical communications. The receiver 420 can be configured to detect a beam interruption or receiver saturation, in part, by measuring the power of the received optical signal. In response to a sudden beam interruption, the received signal can suddenly increase in power. Similarly, the receiver 420 may saturate if the amount of transmit power is much greater than required to determine ranging to a target. In both of the conditions, the PFLS 100 can reduce the output optical power for eye safety issues. The receiver 420 may detect sudden beam interruption or saturation and may report the condition to the processor control module 410 or directly to the PFLS 100. The processor control module 410 or the PFLS 100 can then reduce the output optical power. For example, the processor control module 410 or the PFLS 100 may reduce the pump laser diode power or may reduce the PRF or both.

In one embodiment, the PFLS 100 PRF and pump power can be adjusted such that the overall transmitted optical energy complies with values consistent with safety requirements or standards. Typically, the interrogator 400 can be configured to operate in various predetermined modes with at least one of the modes complying with the eye-safety requirements. The interrogator 400 can revert to eye-safe modes upon beam interruption and saturation.

The above description of the disclosed embodiments is provided to enable any person skilled in the art to make or use the disclosure. Various modifications to these embodiments will be readily apparent to those skilled in the art, and the generic principles defined herein may be applied to other embodiments without departing from the scope of the disclosure. Thus, the disclosure is not intended to be limited to the embodiments shown herein but is to be accorded the widest scope consistent with the principles and novel features disclosed herein.

What is claimed is:

1. A pulsed fiber laser comprising:
a first optical source having an output configured to operate at a first optical wavelength;
an optical fiber having a core coupled to the output of the first optical source;
a second optical source having an output coupled to the optical fiber and configured to operate at a second optical wavelength, and configured to provide v-groove side pumping of a cladding layer of the optical fiber; and
a narrowband optical filter coupled to the optical fiber and having a passband with a bandwidth less than or equal to 5 nm, and that includes the first optical wavelength, and configured to suppress an amplified spontaneous emission in the optical fiber, wherein the passband has a temperature dependence substantially equal to a temperature response of the first optical source.

2. The pulsed fiber laser of claim 1, wherein the first optical source comprises a Distributed Feedback (DFB) laser.

3. The pulsed fiber laser of claim 1, wherein the first optical wavelength comprises approximately 1550 nm.

4. The pulsed fiber laser of claim 1, wherein the output of the first optical source is pulsed at a pulse repetition frequency.

5. The pulsed fiber laser of claim 4, wherein the output of the second optical source is pulsed at substantially the pulse repetition frequency and at a duty cycle that is less than 50%.

6. The pulsed fiber laser of claim 1, wherein the output of the first optical source is pulsed at less than or equal to a 50% duty cycle.

7. The pulsed fiber laser of claim 1, wherein the optical fiber comprises an optical fiber at least partially doped with a rare earth element.

8. The pulsed fiber laser of claim 1, wherein the optical fiber comprises a dual clad optical fiber.

9. The pulsed fiber laser of claim 8, wherein the second optical wavelength comprises a wavelength within an absorption band of a dopant of the dual clad optical fiber.

10. The pulsed fiber laser of claim 1, wherein the optical fiber comprises an Erbium/Ytterbium (Er/Yb) doped dual clad optical fiber.

11. The pulsed fiber laser of claim 10, wherein the second optical source comprises a laser diode configured to side pump an Er/Yb cladding layer of the Er/Yb doped dual clad optical fiber.

12. The pulsed fiber laser of claim 1, wherein the narrowband optical filter comprises a thin film filter.

13. The pulsed fiber laser of claim 1, wherein the narrowband optical filter comprises a fiber Bragg grating.

14. The pulsed fiber laser of claim 1, wherein the narrowband optical filter comprises
an optical circulator.

15. The pulsed fiber laser of claim 1, further comprising:
a housing having a volume of less than 52 cm$^3$, and
wherein the first optical source, optical fiber, second optical source, and narrowband filter are contained within the housing.

16. A pulsed fiber laser comprising:
a first optical source having an output configured to operate at a first optical wavelength;
an Erbium/Ytterbium (Er/Yb) doped dual clad optical fiber coupled to the output of the first optical source;
a second optical source comprising a laser diode configured to side pump an Er/Yb cladding layer of the Er/Yb doped dual clad optical fiber and having an output coupled to the optical fiber and configured to operate at a second optical wavelength, wherein the second optical wavelength comprises a wavelength within the band of 920–970 nm, and to provide a pump signal to the optical fiber; and
a narrowband optical filter coupled to the optical fiber and having a passband that includes the first optical wavelength, and configured to suppress an amplified spontaneous emission in the optical fiber.

17. A pulsed fiber laser comprising:
a first optical source having an output configured to operate at a first optical wavelength;
an Erbium/Ytterbium (Er/Yb) doped dual clad optical fiber coupled to the output of the first optical source;
a second optical source comprising a laser diode configured to pump a cladding layer of the dual clad optical fiber, and wherein the second optical wavelength comprises a wavelength within a band comprising 0.8–1.1 µm, and having an output coupled to the optical fiber and configured to operate at a second optical wavelength, and to provide a pump signal to the optical fiber; and
a narrowband optical filter coupled to the optical fiber and having a passband that includes the first optical wavelength, and configured to suppress an amplified spontaneous emission in the optical fiber.

18. A pulsed fiber laser comprising:
a distributed feedback (DFB) laser having an output configured to provide a pulsed output at a pulsed repetition frequency and a first optical wavelength;
an Erbium/Ytterbium (Er/Yb) doped double clad optical fiber coupled to the output of the DFB laser;
a laser diode configured to provide v-groove side pumping of a cladding layer of the Er/Yb doped double clad optical fiber;
an optical filter coupled to the Er/Yb doped double clad optical fiber and having a passband comprising the first optical wavelength; and
a housing having a volume of less than 53 cm$^3$, and
wherein the DFB laser, optical fiber, laser diode, and optical filter are contained within the housing.

19. The pulsed fiber laser of claim 18, wherein the laser diode is pulsed at substantially the pulse repetition frequency.

20. The pulsed fiber laser of claim 18, wherein the first optical wavelength comprises 1550 nm.

21. The pulsed fiber laser of claim 18, wherein the laser diode is configured to pump the cladding layer at a wavelength within an absorption band of an element within the cladding layer.

22. A pulsed fiber laser comprising:
an electrical pulse generator configured to generate electrical pulses;

a distributed feedback (DFB) laser having an electrical input coupled to the electrical pulse generator and an optical output, and configured to provide a pulsed optical output signal at a wavelength of approximately 1550 nm in response to the electrical pulses;

an Erbium/Ytterbium (Er/Yb) fiber amplifier coupled to the optical output of the DFB laser and configured to amplify the DFB laser pulsed optical output signal;

a pump diode laser having an output wavelength of approximately 950 nm and configured to provide v-groove side pumping of the Er/Yb fiber amplifier;

a power supply configured to selectively energize the pump diode laser; and a narrowband optical filter coupled to the fiber amplifier and configured to have a passband comprising a wavelength of the pulsed optical output signal and further configured to suppress amplified spontaneous emission generated in the fiber amplifier.

23. The pulsed fiber laser of claim 22, wherein the fiber amplifier is configured to provide a single stage gain in excess of 55 dB.

24. The pulsed fiber laser of claim 22, wherein the DFB laser pulsed optical output comprises an optical pulse of less than or equal to 10 nanoseconds.

25. The pulsed fiber laser of claim 22, wherein the narrowband optical filter comprises a passband of less than or equal to 5 nm.

26. The pulsed fiber laser of claim 22, wherein the narrowband optical filter comprises a passband that is tuned to match a temperature response of the DFB laser optical output.

27. A pulsed fiber laser comprising:

means for generating seed optical pulses;

means for amplifying seed optical pulses coupled to the means for generating seed optical pulses, the means for amplifying seed optical pulses comprising:

means for converting a pumping energy to a signal energy; and means for generating a pumping energy coupled to the means for converting the pumping energy to the signal energy; and means for suppressing amplified spontaneous emissions generated by the means for amplifying the seed optical pulses.

28. A method for generating a pulsed laser output, the method comprising:

generating seed optical pulses;

coupling the seed optical pulses to a single mode layer of an Erbium/Ytterbium (Er/Yb) double clad optical fiber;

v-groove side pumping an Er/Yb clad layer of the Er/Yb double clad fiber with an optical output from a pump diode at a wavelength within a band of 08–1.1 μm;

amplifying the seed optical pulses at least in part in response to pumping the Er/Yb clad layer; and suppressing amplified spontaneous emissions generated in the Er/Yb double clad optical fiber.

29. The method of claim 28, wherein generating seed optical pulses comprises:

receiving electrical pulses at an electrical input of a distributed feedback (DFB) laser; and generating, with the DFB laser, optical pulses at a wavelength of approximately 1550 nm in response to the electrical pulses.

30. The method of claim 28, wherein pumping the Er/Yb clad layer comprises:

generating a pump signal with a diode laser; and side groove coupling the pump signal to the Er/Yb clad layer.

* * * * *